US011774231B2

(12) United States Patent
Choi

(10) Patent No.: US 11,774,231 B2
(45) Date of Patent: Oct. 3, 2023

(54) METHOD FOR CALCULATING CAPACITANCE AND METHOD FOR CALCULATING THICKNESS OF SUBSTRATE

(71) Applicant: Samsung Display Co., Ltd., Yongin-si (KR)

(72) Inventor: Jungho Choi, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 7 days.

(21) Appl. No.: 17/343,576

(22) Filed: Jun. 9, 2021

(65) Prior Publication Data

US 2021/0389113 A1 Dec. 16, 2021

(30) Foreign Application Priority Data

Jun. 11, 2020 (KR) .................. 10-2020-0070847

(51) Int. Cl.
*G01R 27/26* (2006.01)
*G01B 7/06* (2006.01)

(52) U.S. Cl.
CPC ......... *G01B 7/085* (2013.01); *G01R 27/2605* (2013.01)

(58) Field of Classification Search
CPC .... G01B 7/085; G01B 21/08; G01R 27/2605; G09G 3/006; G03F 7/16; G02F 1/1303;

(Continued)

(56) References Cited

U.S. PATENT DOCUMENTS

| 7,655,510 B2 * | 2/2010 | Nakayoshi .......... H01L 27/1214 438/149 |
| 2004/0233608 A1 * | 11/2004 | Brcka ............... H01J 37/32623 361/234 |

(Continued)

FOREIGN PATENT DOCUMENTS

| CN | 101082781 B * | 1/2011 | ......... G03F 7/70216 |
| JP | 2006019442 A * | 1/2006 | |

(Continued)

*Primary Examiner* — Son T Le
(74) *Attorney, Agent, or Firm* — Lewis Roca Rothgerber Christie LLP

(57) ABSTRACT

A method comprising: measuring a plurality of measurement capacitances using a capacitance measurement device; calculating a plurality of deposition coefficients for the deposition parameter corresponding to each of the plurality of the measurement capacitances, a plurality of exposure coefficients for the exposure parameter corresponding to each of the plurality of the measurement capacitances, and a plurality of etching coefficients for the etching parameter corresponding to each of the plurality of the measurement capacitances; calculating a corrected deposition coefficient for the plurality of the deposition coefficients, a corrected exposure coefficient for the plurality of the exposure coefficients, and a corrected etching coefficient for the plurality of the etching coefficients; and calculating the capacitance based on a capacitance calculation equation including the deposition parameter, the corrected deposition coefficient, the exposure parameter, the corrected exposure coefficient, the etching parameter, and the corrected etching coefficient.

12 Claims, 8 Drawing Sheets

(58) Field of Classification Search
CPC ............... G02F 1/1333; H01L 27/1259; H01L 27/1222; H01L 27/1237; H01L 27/124; H01L 27/3258; H01L 51/5206; H01L 2227/323
See application file for complete search history.

(56) References Cited

U.S. PATENT DOCUMENTS

2011/0264256 A1\* 10/2011 Cheng .............. G05B 19/40937
700/105
2017/0351358 A1\* 12/2017 Matsumoto ........... G06F 3/0412

FOREIGN PATENT DOCUMENTS

| KR | 20070071200 A | \* | 7/2007 | ............. G02F 1/133 |
| KR | 10-0982306 | | 9/2010 | |
| TW | 201301237 A | \* | 1/2013 | ........... G09G 3/3629 |

\* cited by examiner

FIG. 4

| FIRST MEASUREMENT CAPACITANCE | | | |
|---|---|---|---|
| PARAMETER | DEPOSITION PARAMETER | EXPOSURE PARAMETER | ETCHING PARAMETER |
| COEFFICIENT | DEPOSITION COEFFICIENT | EXPOSURE COEFFICIENT | ETCHING COEFFICIENT |

| SECOND MEASUREMENT CAPACITANCE | | | |
|---|---|---|---|
| PARAMETER | DEPOSITION PARAMETER | EXPOSURE PARAMETER | ETCHING PARAMETER |
| COEFFICIENT | DEPOSITION COEFFICIENT | EXPOSURE COEFFICIENT | ETCHING COEFFICIENT |

⋮

| m-th MEASUREMENT CAPACITANCE | | | |
|---|---|---|---|
| PARAMETER | DEPOSITION PARAMETER | EXPOSURE PARAMETER | ETCHING PARAMETER |
| COEFFICIENT | DEPOSITION COEFFICIENT | EXPOSURE COEFFICIENT | ETCHING COEFFICIENT |

FIG. 5

| FIRST MEASUREMENT CAPACITANCE ||||||
|---|---|---|---|---|---|
| DEPOSITION PARAMETER | FIRST DEPOSITION COEFFICIENT | SECOND DEPOSITION COEFFICIENT | THIRD DEPOSITION COEFFICIENT | ... | n-TH DEPOSITION COEFFICIENT |
| DEPOSITION COEFFICIENTS | FIRST DEPOSITION COEFFICIENT | SECOND DEPOSITION COEFFICIENT | THIRD DEPOSITION COEFFICIENT | ... | n-TH DEPOSITION COEFFICIENT |
| EXPOSURE PARAMETER | FIRST EXPOSURE PARAMETER | SECOND EXPOSURE PARAMETER | THIRD EXPOSURE PARAMETER | ... | p-TH EXPOSURE PARAMETER |
| EXPOSURE COEFFICIENTS | FIRST EXPOSURE COEFFICIENT | SECOND EXPOSURE COEFFICIENT | THIRD EXPOSURE COEFFICIENT | ... | p-TH EXPOSURE COEFFICIENT |
| ETCHING PARAMETER | FIRST ETCHING PARAMETER | SECOND ETCHING PARAMETER | THIRD ETCHING PARAMETER | ... | q-TH ETCHING PARAMETER |
| ETCHING COEFFICIENTS | FIRST ETCHING COEFFICIENT | SECOND ETCHING COEFFICIENT | THIRD ETCHING COEFFICIENT | ... | q-TH ETCHING COEFFICIENT |

| SECOND MEASUREMENT CAPACITANCE ||||||
|---|---|---|---|---|---|
| DEPOSITION PARAMETER | FIRST DEPOSITION COEFFICIENT | SECOND DEPOSITION COEFFICIENT | THIRD DEPOSITION COEFFICIENT | ... | n-TH DEPOSITION COEFFICIENT |
| DEPOSITION COEFFICIENTS | FIRST DEPOSITION COEFFICIENT | SECOND DEPOSITION COEFFICIENT | THIRD DEPOSITION COEFFICIENT | ... | n-TH DEPOSITION COEFFICIENT |
| EXPOSURE PARAMETER | FIRST EXPOSURE PARAMETER | SECOND EXPOSURE PARAMETER | THIRD EXPOSURE PARAMETER | ... | p-TH EXPOSURE PARAMETER |
| EXPOSURE COEFFICIENTS | FIRST EXPOSURE COEFFICIENT | SECOND EXPOSURE COEFFICIENT | THIRD EXPOSURE COEFFICIENT | ... | p-TH EXPOSURE COEFFICIENT |
| ETCHING PARAMETER | FIRST ETCHING PARAMETER | SECOND ETCHING PARAMETER | THIRD ETCHING PARAMETER | ... | q-TH ETCHING PARAMETER |
| ETCHING COEFFICIENTS | FIRST ETCHING COEFFICIENT | SECOND ETCHING COEFFICIENT | THIRD ETCHING COEFFICIENT | ... | q-TH ETCHING COEFFICIENT |

⋮

| m-th MEASUREMENT CAPACITANCE ||||||
|---|---|---|---|---|---|
| DEPOSITION PARAMETER | FIRST DEPOSITION COEFFICIENT | SECOND DEPOSITION COEFFICIENT | THIRD DEPOSITION COEFFICIENT | ... | n-TH DEPOSITION COEFFICIENT |
| DEPOSITION COEFFICIENTS | FIRST DEPOSITION COEFFICIENT | SECOND DEPOSITION COEFFICIENT | THIRD DEPOSITION COEFFICIENT | ... | n-TH DEPOSITION COEFFICIENT |
| EXPOSURE PARAMETER | FIRST EXPOSURE PARAMETER | SECOND EXPOSURE PARAMETER | THIRD EXPOSURE PARAMETER | ... | p-TH EXPOSURE PARAMETER |
| EXPOSURE COEFFICIENTS | FIRST EXPOSURE COEFFICIENT | SECOND EXPOSURE COEFFICIENT | THIRD EXPOSURE COEFFICIENT | ... | p-TH EXPOSURE COEFFICIENT |
| ETCHING PARAMETER | FIRST ETCHING PARAMETER | SECOND ETCHING PARAMETER | THIRD ETCHING PARAMETER | ... | q-TH ETCHING PARAMETER |
| ETCHING COEFFICIENTS | FIRST ETCHING COEFFICIENT | SECOND ETCHING COEFFICIENT | THIRD ETCHING COEFFICIENT | ... | q-TH ETCHING COEFFICIENT |

FIG. 7

| FIRST MEASUREMENT THICKNESS | | | |
|---|---|---|---|
| PARAMETER | CELANING PARAMETER | COATING PARAMETER | DRYING PARAMETER |
| COEFFICIENT | CELANING COEFFICIENT | COATING COEFFICIENT | DRYING COEFFICIENT |

| SECOND MEASUREMENT THICKNESS | | | |
|---|---|---|---|
| PARAMETER | CELANING PARAMETER | COATING PARAMETER | DRYING PARAMETER |
| COEFFICIENT | CELANING COEFFICIENT | COATING COEFFICIENT | DRYING COEFFICIENT |

⋮

| m-th MEASUREMENT THICKNESS | | | |
|---|---|---|---|
| PARAMETER | CELANING PARAMETER | COATING PARAMETER | DRYING PARAMETER |
| COEFFICIENT | CELANING COEFFICIENT | COATING COEFFICIENT | DRYING COEFFICIENT |

FIG. 8

| FIRST MEASUREMENT THICKNESS | | | | | |
|---|---|---|---|---|---|
| CLEANING PARAMETER | FIRST CLEANING PARAMETER | SECOND CLEANING PARAMETER | THIRD CLEANING PARAMETER | ... | n-TH CLEANING PARAMETER |
| CLEANING COEFFICIENTS | FIRST CLEANING COEFFICIENT | SECOND CLEANING COEFFICIENT | THIRD CLEANING COEFFICIENT | ... | n-TH CLEANING COEFFICIENT |
| COATING PARAMETER | FIRST COATING PARAMETER | SECOND COATING PARAMETER | THIRD COATING PARAMETER | ... | p-TH COATING PARAMETER |
| COATING COEFFICIENTS | FIRST COATING COEFFICIENT | SECOND COATING COEFFICIENT | THIRD COATING COEFFICIENT | ... | p-TH COATING COEFFICIENT |
| DRYING PARAMETER | FIRST DRYING PARAMETER | SECOND DRYING PARAMETER | THIRD DRYING PARAMETER | ... | q-TH DRYING PARAMETER |
| DRYING COEFFICIENTS | FIRST DRYING COEFFICIENT | SECOND DRYING COEFFICIENT | THIRD DRYING COEFFICIENT | ... | q-TH DRYING COEFFICIENT |

| SECOND MEASUREMENT THICKNESS | | | | | |
|---|---|---|---|---|---|
| CLEANING PARAMETER | FIRST CLEANING PARAMETER | SECOND CLEANING PARAMETER | THIRD CLEANING PARAMETER | ... | n-TH CLEANING PARAMETER |
| CLEANING COEFFICIENTS | FIRST CLEANING COEFFICIENT | SECOND CLEANING COEFFICIENT | THIRD CLEANING COEFFICIENT | ... | n-TH CLEANING COEFFICIENT |
| COATING PARAMETER | FIRST COATING PARAMETER | SECOND COATING PARAMETER | THIRD COATING PARAMETER | ... | p-TH COATING PARAMETER |
| COATING COEFFICIENTS | FIRST COATING COEFFICIENT | SECOND COATING COEFFICIENT | THIRD COATING COEFFICIENT | ... | p-TH COATING COEFFICIENT |
| DRYING PARAMETER | FIRST DRYING PARAMETER | SECOND DRYING PARAMETER | THIRD DRYING PARAMETER | ... | q-TH DRYING PARAMETER |
| DRYING COEFFICIENTS | FIRST DRYING COEFFICIENT | SECOND DRYING COEFFICIENT | THIRD DRYING COEFFICIENT | ... | q-TH DRYING COEFFICIENT |

⋮

| m-th MEASUREMENT THICKNESS | | | | | |
|---|---|---|---|---|---|
| CLEANING PARAMETER | FIRST CLEANING PARAMETER | SECOND CLEANING PARAMETER | THIRD CLEANING PARAMETER | ... | n-TH CLEANING PARAMETER |
| CLEANING COEFFICIENTS | FIRST CLEANING COEFFICIENT | SECOND CLEANING COEFFICIENT | THIRD CLEANING COEFFICIENT | ... | n-TH CLEANING COEFFICIENT |
| COATING PARAMETER | FIRST COATING PARAMETER | SECOND COATING PARAMETER | THIRD COATING PARAMETER | ... | p-TH COATING PARAMETER |
| COATING COEFFICIENTS | FIRST COATING COEFFICIENT | SECOND COATING COEFFICIENT | THIRD COATING COEFFICIENT | ... | p-TH COATING COEFFICIENT |
| DRYING PARAMETER | FIRST DRYING PARAMETER | SECOND DRYING PARAMETER | THIRD DRYING PARAMETER | ... | q-TH DRYING PARAMETER |
| DRYING COEFFICIENTS | FIRST DRYING COEFFICIENT | SECOND DRYING COEFFICIENT | THIRD DRYING COEFFICIENT | ... | q-TH DRYING COEFFICIENT |

METHOD FOR CALCULATING CAPACITANCE AND METHOD FOR CALCULATING THICKNESS OF SUBSTRATE

CROSS-REFERENCE TO RELATED APPLICATION

The present application claims priority to and the benefit of Korean Patent Application No. 10-2020-0070847, filed on Jun. 11, 2020 in the Korean Intellectual Property Office (KIPO), the entire content of which is hereby incorporated by reference.

BACKGROUND

1. Field

Aspects of some embodiments of the present inventive concept relate to a method for calculating a capacitance and a method for calculating a thickness of a substrate.

2. Description of Related Art

In a mass production line of a display device, a plurality of processes are performed to produce the display device. Measurements may be performed on the display device to confirm whether or not the processes are being performed properly. For example, the measurements may be related to physical properties (e.g., capacitance, thickness of a substrate) of the display device. The measurements may be performed after the display device is completely manufactured or after the display device is manufactured to a specific stage.

In this case, when there is a problem with the display device, additional time and costs may be consumed to re-manufacture the display device.

The above information disclosed in this Background section is only for enhancement of understanding of the background and therefore the information discussed in this Background section does not necessarily constitute prior art.

SUMMARY

Aspects of some embodiments of the present inventive concept may relate to determining and measuring the physical characteristics of a display device during the manufacturing process of the display device.

Aspects of some embodiments of the present inventive concept relate to a method for calculating a capacitance and a method for calculating a thickness of a substrate. For example, some embodiments of the present inventive concept relate to a method for calculating a capacitance during a manufacturing process and a method for calculating a thickness of a substrate during a manufacturing process.

Some embodiments include a method for calculating a capacitance.

Some embodiments include a method for calculating a thickness of a substrate.

According to some embodiments of the present inventive concept, in a method for calculating a capacitance based on a deposition parameter for a deposition process, an exposure parameter for an exposure process, and an etching parameter for an etching process during a manufacturing process of a display device, the method may include measuring a plurality of measurement capacitances using a capacitance measurement device, calculating a plurality of deposition coefficients for the deposition parameter corresponding to each of the plurality of the measurement capacitances, a plurality of exposure coefficients for the exposure parameter corresponding to each of the plurality of the measurement capacitances, and a plurality of etching coefficients for the etching parameter corresponding to each of the plurality of the measurement capacitances, calculating a corrected deposition coefficient for the plurality of the deposition coefficients, a corrected exposure coefficient for the plurality of the exposure coefficients, and a corrected etching coefficient for the plurality of the etching coefficients and calculating the capacitance based on a capacitance calculation equation including the deposition parameter, the corrected deposition coefficient, the exposure parameter, the corrected exposure coefficient, the etching parameter, and the corrected etching coefficient.

According to some embodiments of the present inventive concept, the plurality of deposition coefficients, the plurality of exposure coefficients, and the plurality of etching coefficients may be calculated by multiple regression analysis.

According to some embodiments of the present inventive concept, the corrected deposition coefficient, the corrected exposure coefficient, and the corrected etching coefficient may be calculated by Bayesian theorem.

According to some embodiments of the present inventive concept, when the calculated capacitance may be within an allowable range by comparing the plurality of the measurement capacitances with the calculated capacitance, the manufacturing process of the display device may be performed by applying the capacitance calculation equation, after calculating the capacitance.

According to some embodiments of the present inventive concept, when the calculated capacitance may outside an allowable range by comparing the plurality of the measurement capacitances with the calculated capacitance, the capacitance calculation equation may reset, after calculating the capacitance.

According to some embodiments of the present inventive concept, the display device may include an active layer, a gate electrode layer on the active layer, and at least partially overlapping the active layer, a source electrode layer on the gate electrode layer, and at least partially overlapping the gate electrode layer and a lower electrode layer on the source electrode layer, and at least partially overlapping the source electrode layer.

According to some embodiments of the present inventive concept, the capacitance may be a capacitance between the active layer and the gate electrode layer.

According to some embodiments of the present inventive concept, the capacitance may be a capacitance between the gate electrode layer and the source electrode layer.

According to some embodiments of the present inventive concept, the capacitance may be a capacitance between the source electrode layer and the lower electrode layer.

According to some embodiments of the present inventive concept, the capacitance may be a capacitance between the active layer, the gate electrode layer, and the source electrode layer.

According to some embodiments of the present inventive concept, the capacitance may be a capacitance between the gate electrode layer, the source electrode layer, and the lower electrode.

According to some embodiments of the present inventive concept, the deposition process may include a chemical vapor deposition process, and the etching process includes a dry etching process.

According to some embodiments of the present inventive concept, in a method for calculating a thickness of a substrate based on a cleaning parameter for a cleaning process, a coating parameter for a coating process, and a drying parameter for a drying process during a manufacturing process of a display device, the method may include measuring a plurality of measurement thicknesses using a thickness measuring device, calculating a plurality of cleaning coefficients for the cleaning parameter corresponding to each of the plurality of the measurement thicknesses, a plurality of coating coefficients for the coating parameter corresponding to each of the plurality of the measurement thicknesses, and a plurality of drying coefficients for the drying parameter corresponding to each of the plurality of the measurement thicknesses, calculating a corrected cleaning coefficient for the plurality of the cleaning coefficients, a corrected coating coefficient for the plurality of the coating coefficients, and a corrected drying coefficient for the plurality of the drying coefficients and calculating the thickness of the substrate based on a thickness calculation equation including the cleaning parameter, the corrected cleaning coefficient, the coating parameter, the corrected coating coefficient, the drying parameter, and the corrected drying coefficient.

According to some embodiments of the present inventive concept, the plurality of the cleaning coefficients, the plurality of the coating coefficients, and the plurality of the drying coefficients may be calculated by multiple regression analysis.

According to some embodiments of the present inventive concept, the corrected cleaning coefficient, the corrected coating coefficient, and the corrected drying coefficient may be calculated by Bayesian theorem.

According to some embodiments of the present inventive concept, when the calculated thickness may be within an allowable range by comparing the plurality of the measurement thicknesses with the calculated thickness, the manufacturing process of the display device may be performed by applying the thickness calculation equation, after calculating the thickness.

According to some embodiments of the present inventive concept, when the calculated thickness may be outside an allowable range by comparing the plurality of the measurement thicknesses with the calculated thickness, the capacitance calculation equation may be reset, after calculating the thickness.

According to some embodiments of the present inventive concept, the substrate includes polyimide.

As described above, in a method for calculating a capacitance based on a deposition parameter for a deposition process, an exposure parameter for an exposure process, and an etching parameter for an etching process during a manufacturing process of a display device, the method may include measuring a plurality of measurement capacitances using a capacitance measurement device, calculating a plurality of deposition coefficients for the deposition parameter corresponding to each of the plurality of the measurement capacitances, a plurality of exposure coefficients for the exposure parameter corresponding to each of the plurality of the measurement capacitances, and a plurality of etching coefficients for the etching parameter corresponding to each of the plurality of the measurement capacitances, calculating a corrected deposition coefficient for the plurality of the deposition coefficients, a corrected exposure coefficient for the plurality of the exposure coefficients, and a corrected etching coefficient for the plurality of the etching coefficients and calculating the capacitance based on a capacitance calculation equation including the deposition parameter, the corrected deposition coefficient, the exposure parameter, the corrected exposure coefficient, the etching parameter, and the corrected etching coefficient.

Accordingly, it may be possible to calculate the capacitance of the separate display device without separate measurement even during the manufacturing process of the separate display device using the capacitance calculation equation. Through this, it is possible to determine whether the capacitance is within an allowable range based on the parameters during the manufacturing process of the display device.

BRIEF DESCRIPTION OF THE DRAWINGS

The above and other features of the present inventive concept will become more apparent by describing in more detail aspects of some embodiments thereof with reference to the accompanying drawings.

FIG. 4 is a diagram illustrating a deposition coefficient, an exposure coefficient, and an etching coefficient for each of measurement capacitances according to some embodiments.

FIG. 5 is a diagram illustrating deposition coefficients, exposure coefficients, and etching coefficients for each of measurement capacitances according to some embodiments.

FIG. 7 is a diagram illustrating a cleaning coefficient, a coating coefficient, and a drying coefficient for each of measurement thicknesses according to some embodiments.

FIG. 8 is a diagram illustrating cleaning coefficients, coating coefficients and drying coefficients for each of the measurement thicknesses according to some embodiments.

DETAILED DESCRIPTION

Figure 1:
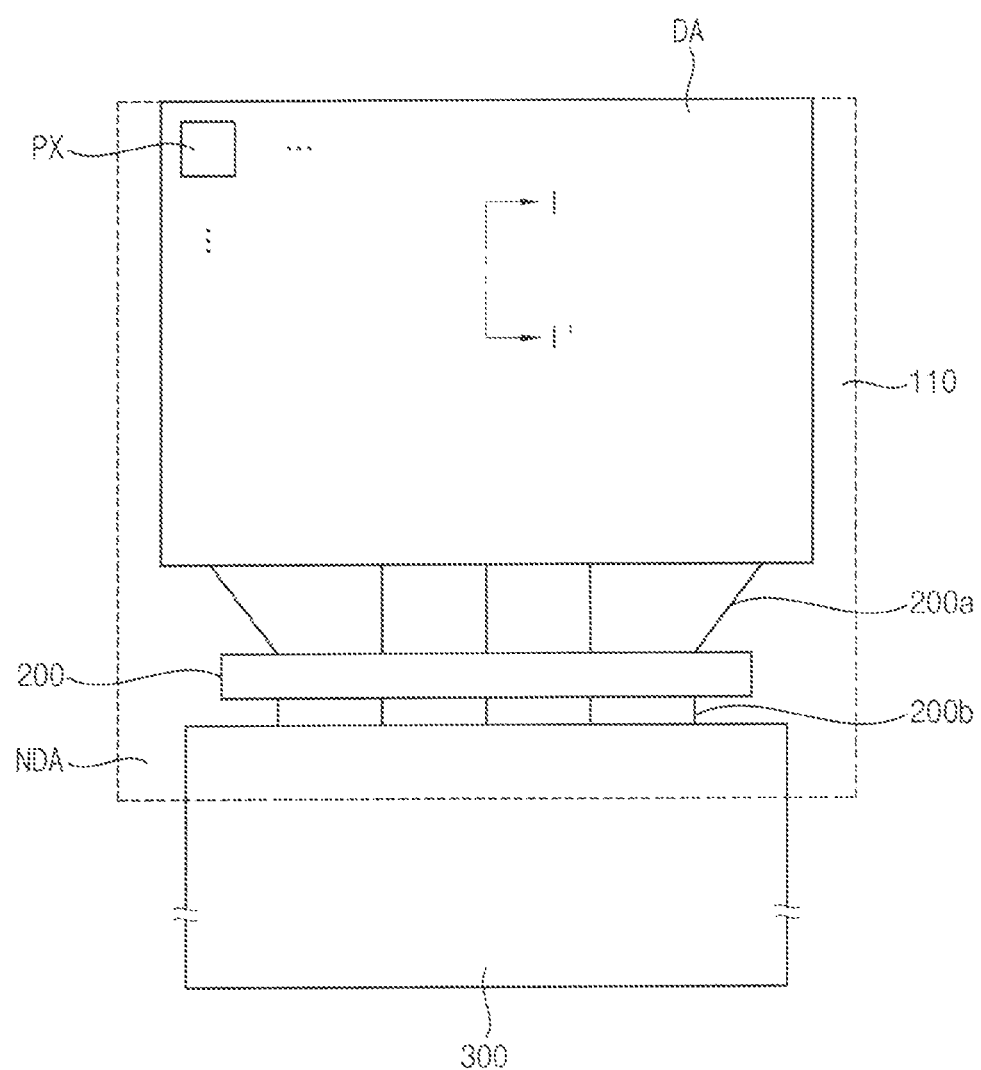
FIG. 1 is a plan view illustrating a display device according to some embodiments of the present invention.

Aspects of some embodiments of the present inventive concept include a method for calculating a capacitance and a method for calculating a thickness of a substrate.

Aspects of some embodiments of the present inventive concept also provide a method of driving a display panel using the display apparatus.

Hereinafter, aspects of some embodiments of the present inventive concept will be explained in more detail with reference to the accompanying drawings. Like reference numerals may refer to like elements throughout this application.

FIG. 1 is a plan view illustrating a display device according to some embodiments of the present invention.

Referring to FIG. 1, a display device may include a display area DA and a non-display area surrounding the display area DA.

According to some embodiments, a plurality of pixels PX may be located in the display area DA. The pixels PX may be entirely arranged in the display area DA in a matrix form or arrangement (e.g., in a plurality of rows and columns). However, this is merely an example, and the pixels PX may be arranged in various forms or arrangements in the display area DA. The display device may display an image on the display area DA through the pixels PX. The display device may include an organic light emitting display device. However, this is merely an example, and the display device may include a liquid crystal display device, an electrophoretic display device, and a plasma display device.

According to some embodiments, a driver 200 for driving the pixels PX may be located in the non-display area NDA. The driver 200 may transmit signals (e.g., a data signal, a power voltage, and the like) to the display area DA through fan-out lines 200a. The driver 200 may receive the signals through transmission lines 200b. The driver 200 may transmit the signals to the display area DA through the fan-out lines 200a. In FIG. 1, the driver 200 is illustrated as being located in the non-display area NDA, but embodiments according to the present invention are not limited thereto. For example, the driver 200 may be located on the circuit film 300, or any other suitable location according to the design of the display device. The circuit film 300 may be located on the non-display area NDA to receive the signals from the outside.

The fan-out lines 200a may be located at the non-display area NDA. The fan-out lines 200a may be located between the display area DA and the driver 200. The fan-out lines 200a may electrically connect the driver 200 located in the non-display area NDA and the pixels PX located in the display area DA. The fan-out lines 200a may include data signal lines, power voltage lines, and the like.

Figure 2:
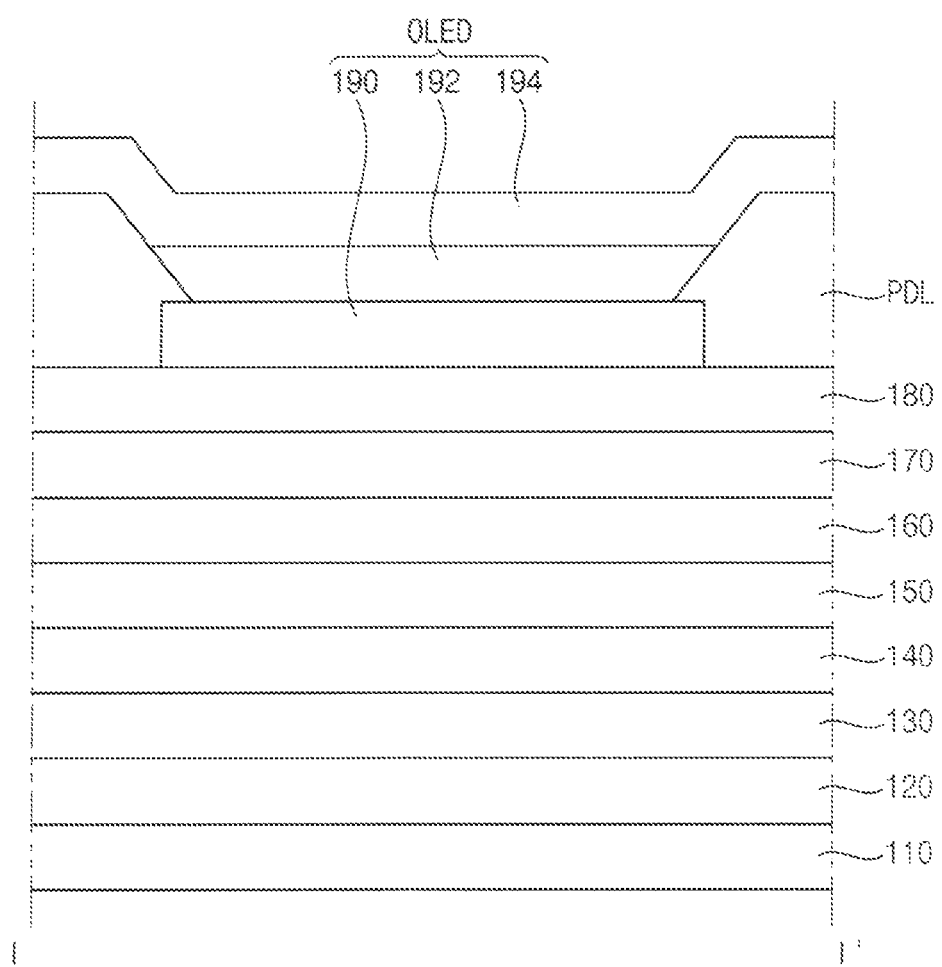
FIG. 2 is a cross-sectional view illustrating aspects of the display device of FIG. 1 cut along the line I-I' according to some embodiments.

FIG. 2 is a cross-sectional view illustrating aspects of some embodiments of the display device of FIG. 1 cut along the line I-I'.

Referring to FIGS. 1 and 2, the display device may include a substrate 110, an active layer 120, a gate insulating layer 130, a gate electrode layer 140, an interlayer insulating layer 150, a source electrode layer 160, a passivation layer 170, a via insulating layer 180, a pixel defining layer PDL, and an organic light emitting diode OLED. The organic light emitting diode may include a lower electrode layer 190, an intermediate layer 192, and an upper electrode layer 194. According to some embodiments, the active layer 120, the gate electrode layer 140, the source electrode layer 160, the lower electrode layer 190, and the upper electrode layer 194 may be defined as conductive layers.

The substrate 110 may include a glass substrate, a quartz substrate, a plastic substrate, or the like. According to some embodiments, the substrate 110 may include a plastic substrate, and accordingly, the display device may have a flexible characteristic. In this case, the substrate 110 may have a structure in which at least one organic film layer and at least one barrier layer are alternately stacked. For example, the organic film layer may be formed using an organic material such as polyimide, and the barrier layer may be formed using an inorganic material.

A buffer layer may be located on the substrate 110. The buffer layer may prevent or reduce diffusion of metal atoms or impurities from the substrate 110 to the active layer 120. In addition, the active layer 120 may be uniformly formed by controlling a heat supply rate during a crystallization process for forming the active layer 120 by the buffer layer.

The active layer 120 may be located on the buffer layer. According to some embodiments, the active layer 120 may include a silicon semiconductor. For example, the silicon semiconductor may include amorphous silicon, polycrystalline silicon, or the like. According to some embodiments, the active layer 120 may include an oxide semiconductor. For example, the oxide semiconductor may include one of oxides of zinc, indium, gallium, tin, titanium, and phosphorus, or a combination thereof. For example, the oxide semiconductor may include at least one of zinc oxide, zinc-tin oxide, zinc-indium oxide, indium oxide, titanium oxide, indium gallium-zinc oxide, or indium-zinc-tin oxide.

The gate insulating layer 130 may be located on the active layer 120. The gate insulating layer 130 may insulate the active layer 120 from the gate electrode layer 140. The gate insulating layer 130 may include an insulating material. For example, the gate insulating layer 130 may include silicon oxide, silicon nitride, titanium oxide, tantalum oxide, or the like.

The gate electrode layer 140 may be located on the gate insulating layer 130. A gate signal for applying an on/off signal to a transistor may be applied to the gate electrode layer 140. The gate electrode layer 140 may include a metal, an alloy, a conductive metal oxide, a transparent conductive material, or the like. For example, the gate electrode layer 140 may be silver, an alloy containing silver, molybdenum, an alloy containing molybdenum, aluminum, an alloy containing aluminum, aluminum nitride, tungsten, tungsten nitride, copper, nickel, chromium, chromium nitride, titanium, tantalum, platinum, scandium, indium tin oxide, indium zinc oxide, and the like.

The interlayer insulating layer 150 may be located on the gate electrode layer 140. The interlayer insulating layer 150 may insulate the gate electrode layer 140 and the source electrode layer 160. The interlayer insulating layer 150 may include an insulating material. For example, the interlayer insulating layer 150 may include silicon oxide, silicon nitride, titanium oxide, tantalum oxide, or the like.

The source electrode layer 160 may be located on the interlayer insulating layer 150. The source electrode layer 160 may include a metal, an alloy, a conductive metal oxide, a transparent conductive material, or the like.

The passivation layer 170 may be located on the source electrode layer 160. The passivation layer 170 may be located on the source electrode layer 160. The passivation layer 170 may eliminate a step difference due to the source electrode layer 160 to prevent a defect in the organic light emitting diode OLED from occurring. The passivation layer 170 may include an insulating material such as silicon nitride or silicon oxide. The via insulating layer 180 may be located on the passivation layer 170. The via insulating layer may include an organic insulating material. For example, the via insulating layer 180 may include a photoresist, a polyacrylic resin, a polyimide resin, an acrylic resin, or the like.

The lower electrode layer 190 may be located on the via insulating layer 180. The lower electrode layer 190 may include a metal, an alloy, a conductive metal oxide, a transparent conductive material, or the like. According to some embodiments, the lower electrode layer 190 may be used as an anode electrode. According to some embodiments, the lower electrode layer 190 may be used as a cathode electrode.

The pixel defining layer PDL may be located on the via insulating layer 180 to partition an emitting area of each of the pixels PX. The pixel defining layer PDL may be an organic insulating layer made of an organic material. The organic material may include an organic insulating material such as a polyacrylic compound, a polyimide compound, a fluorine-based carbon compound such as teflon, and a benzocyclobutene compound. The pixel defining layer PDL may include an opening exposing an upper surface of the lower electrode layer 190. According to some embodiments, the lower electrode layer 190 may be used as an anode electrode. According to some embodiments, the lower electrode layer 190 may be used as a cathode electrode.

The intermediate layer 192 may be located on the lower electrode layer 190. The intermediate layer 192 may be provided as a single layer, but may be provided as a multilayer including various functional layers. For example, the intermediate layer 192 may have a structure in which a hole injection layer, a hole transport layer, an emission layer, an electron transport layer, an electron injection layer, and the like are stacked in a single or complex structure.

The upper electrode layer 194 may be located on the intermediate layer 192. The upper electrode layer 194 may cover the pixel defining layer PDL on the intermediate layer 192. According to some embodiments, the upper electrode layer 194 may be used as a cathode electrode. According to some embodiments, the upper electrode layer 194 may be used as an anode electrode.

A capacitor may be formed by two conductive layers and an insulating layer located between the two conductive layers. Electrical energy stored in the display device may be different depending on the capacitance of the capacitor. The capacitor may serve to suppress an abrupt voltage rise or fall of the display device. That is, the performance of the display device may vary according to the capacitance. According to some embodiments, the capacitor may be a storage capacitor that stores electrical energy. According to some embodiments, the capacitor may be a parasitic capacitor generated when an electric signal is applied to the conductive layers.

In a display device, the capacitance of the display device may be measured using a capacitance measuring device after the manufacturing process of the display device has been performed by an operation (e.g., a set or predetermined operation) or more (e.g., forming the source electrode layer 160, forming the upper electrode layer 194, and the like). In this case, if the display device may not secure the desired capacitance, and a manufacturing yield of the display device may decrease as the display device is remanufactured.

However, the method for calculating the capacitance according to the present invention to be described in more detail below may calculate the capacitance through a capacitance calculation equation including a plurality of parameters for manufacturing processes of the display device. Accordingly, even during the manufacturing process of the display device, the capacitance may be determined in advance using the capacitance calculation equation.

Figure 3:
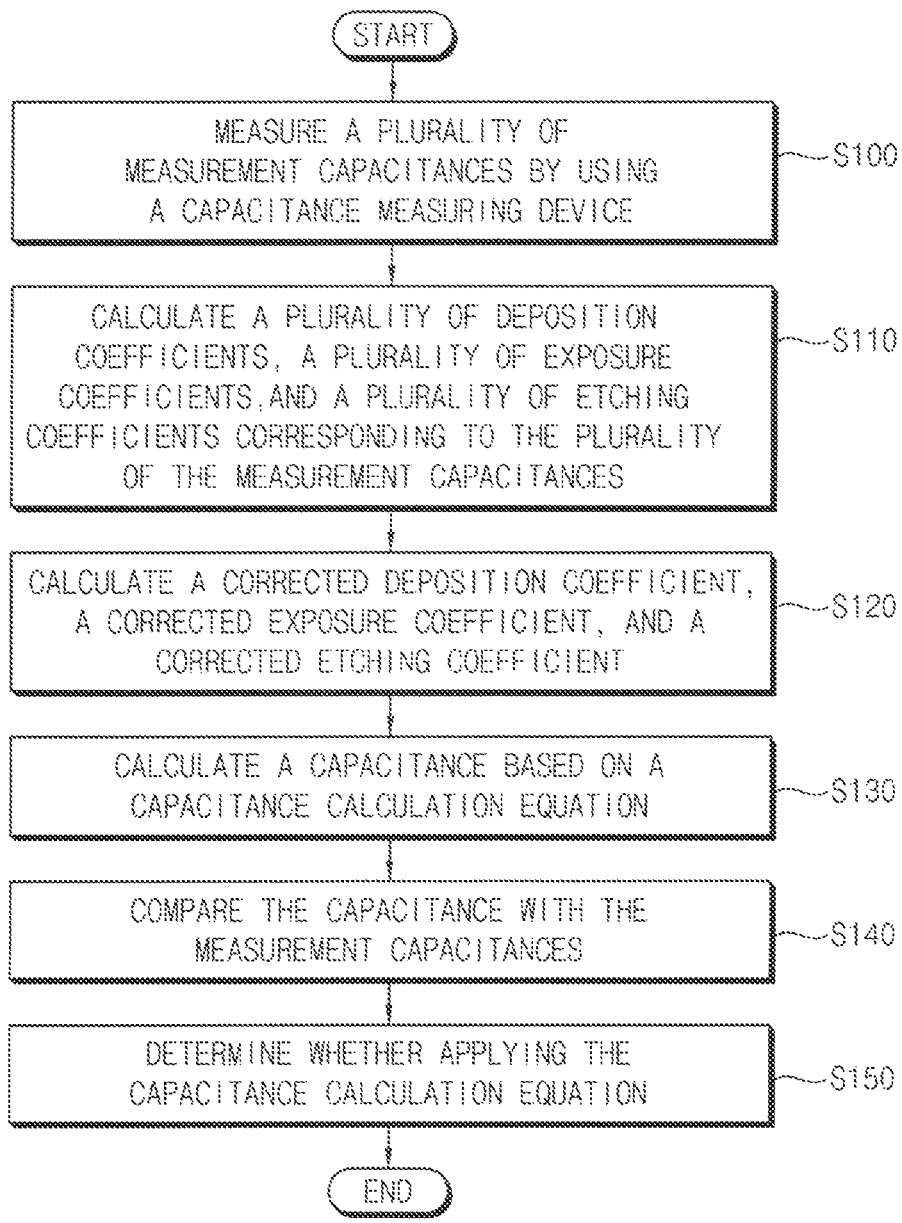
FIG. 3 is a flow chart illustrating a method for calculating capacitance according to some embodiments of the present invention.

FIG. 3 is a flow chart illustrating a method for calculating capacitance according to some embodiments of the present invention, and FIG. 4 is a diagram illustrating a deposition coefficient, an exposure coefficient, and an etching coefficient for each of measurement capacitances.

Referring to FIGS. 2 to 4, a plurality of measurement capacitances may be measured using the capacitance measurement device (S100). The measurement may be performed on a certain area of the display device. For example, the measurement of the measurement capacitance may be performed for a square area having a length of 200 μm for width and length, respectively, in a plan view (e.g., from a view taken in a direction perpendicular or normal with respect to a plane of the display surface). The measurement of the measurement capacitance may be performed after attaching a first measurement pin to an upper conductive layer and attaching a second measurement pin to a lower conductive layer. According to some embodiments, the measurement of the measurement capacitance may be performed for the active layer 120 and the gate electrode layer 140.

For example, first to m-th measurement capacitances may be measured for the active layer 120 and the gate electrode layer 140 (where m is a natural number equal to or greater than 2). As described above, the measurement of the measurement capacitance for each of the conductive layers of FIG. 2 may be repeatedly performed. According to some embodiments, the measurement of the measurement capacitance may be performed for the gate electrode layer 140 and the source electrode layer 160. According to some embodiments, the measurement of the measurement capacitance may be performed for the source electrode layer 160 and the lower electrode layer 190. According to some embodiments, the measurement of the measurement capacitance may be performed for the active layer 120, the gate electrode layer 140, and the source electrode layer 160. According to some embodiments, the measurement of the measurement capacitance may be performed for the gate electrode layer 140, the source electrode layer 160, and the lower electrode layer 190.

Thereafter, a plurality of deposition coefficients, a plurality of exposure coefficients, and a plurality of etching coefficients corresponding to each of the plurality of measurement capacitances may be calculated (S110). According to some embodiments, the display device may be manufactured through a deposition process, an exposure process, an etching process, or the like. Accordingly, the relationship between the parameters and the measurement capacitances may be grasped using the measurement capacitances, and a deposition parameter for the deposition process, an exposure parameter for the exposure process, an etching parameter for the etching process, and the like. According to some embodiments, in order to determine the relationship, the plurality of deposition coefficients, the plurality of exposure coefficients, and the plurality of etching coefficients may be calculated by multiple regression analysis.

For example, an equation for obtaining the capacitance may be defined as [(dielectric constant*area)/thickness]. Here, the area refers to the area where the conductive layers and the insulating layer overlap, and the thickness refers to the thickness of the insulating layer. In the method for calculating capacitance according to the present invention, the etching parameter and the exposure parameter are substituted for the area, and the deposition parameter is substituted for the thickness to obtain the capacitance.

According to some embodiments, the plurality of the deposition coefficients for the deposition parameter corresponding to each of the plurality of the measurement capacitances may be calculated. The deposition process may include a chemical vapor deposition process, a physical vapor deposition process, a spin-on glass process, and the like. For example, the deposition parameter may relate to any one of a deposition temperature, a deposition pressure, a deposition rate, a deposition time, and a deposition solution concentration. However, this is merely an example, and the deposition parameter may further include parameters affecting the deposition process.

According to some embodiments, the plurality of the exposure coefficients for the exposure parameter corresponding to each of the plurality of the measurement capacitances may be calculated. For example, the exposure parameter may relate to any one of an exposure amount, an exposure time, an exposure speed, an exposure temperature, an exhaust pressure, and an exhaust time. However, this is merely an example, and the exposure parameter may further include parameters affecting the exposure process.

According to some embodiments, the plurality of the etching coefficients for the etching parameter corresponding to each of the plurality of the measurement capacitances may be calculated. The etching process may include dry etching, wet etching, laser etching, or the like. For example, the etching parameter may relate to any one of an etching temperature, an etching pressure, an etching rate, an etching time, and a material to be etched. However, this is merely an example, and the etching parameter may further include parameters affecting the etching process.

For example, the first to m-th measurement capacitances of the active layer 120 and the gate electrode layer 140 may be measured. The deposition parameter affecting the first to mth measurement capacitances may be related to the deposition temperature. The exposure parameter that affects the first to m-th measurement capacitances may be related to the exposure speed. The etching parameter affecting the first to mth measurement capacitances may be related to the etching time. A deposition coefficient, an exposure coefficient, and an etching coefficient for the first measurement capacitance may be calculated by the multiple regression analysis. In addition, the deposition coefficient, the exposure coefficient, and the etching coefficient for the m-th measurement capacitance may be calculated by the multiple regression analysis.

After that, a corrected deposition coefficient, a corrected exposure coefficient, and a corrected etching coefficient may be calculated (S120). The corrected deposition coefficient, the corrected exposure coefficient, and the corrected etching coefficient may be calculated by the Bayesian theorem. According to some embodiments, the corrected deposition coefficient, the corrected exposure coefficient, and the corrected etch coefficient may be calculated by arithmetic mean. However, this is merely an example, and the corrected deposition coefficient, the corrected exposure coefficient, and the corrected etching coefficient may be calculated by various methods. According to some embodiments, the corrected deposition coefficient for the plurality of the deposition coefficients may be calculated. For example, for the deposition coefficient for the first measurement capacitance to the deposition coefficient for the m-th measurement capacitance, a corrected deposition coefficient may be calculated through the Bayesian theorem. The corrected exposure coefficients for the plurality of the exposure coefficients may be calculated. For example, the exposure coefficient for the first measurement capacitance to the exposure coefficient for the m-th measurement capacitance may be calculated through the Bayesian theorem to calculate the corrected exposure coefficient. A corrected etching coefficient for the plurality of the etching coefficients may be calculated. For example, a corrected etching coefficient may be calculated for the etching coefficient for the first measurement capacitance to the etching coefficient for the m-th measurement capacitance through the Bayesian theorem.

Thereafter, the capacitance may be calculated based on the capacitance calculation equation (S130). The capacitance calculation equation may include the deposition parameter, the corrected deposition coefficient, the exposure parameter, the corrected exposure coefficient, the etching parameter, and the corrected etching coefficient. For example, the capacitance may be calculated by adding a product of the deposition parameter and the corrected deposition coefficient, a product of the exposure parameter and the corrected exposure coefficient, and a product of the etching parameter and the corrected etching coefficient.

An expected capacitance according to a change in process conditions for the deposition process, the exposure process, and the etching process may be predicted through the capacitance calculation equation. For example, when the manufacturing process of the display device is performed by changing the deposition rate and the etching pressure, the expected capacitance may be predicted by substituting the changed deposition parameter and the changed etching parameter into the capacitance calculation equation. Accordingly, when the display device has the unexpected capacitance, it may be possible to determine which parameter is caused by the predicted capacitance.

After comparing the calculated capacitance with the measurement capacitances (S140), it may be possible to determine whether to apply the capacitance calculation equation (S150). According to some embodiments, when the calculated capacitance is within an allowable range (e.g., a set or predetermined allowable range), the manufacturing process of the display device may be continued by applying the capacitance calculation equation. In addition, when manufacturing a separate display device, the capacitance calculation equation may be used.

For example, when a difference between the calculated capacitance and the measurement capacitances is less than a certain range (e.g., a set or predetermined range, for example less than 1% of the measurement capacitance), it may be determined that the calculated capacitance is within the allowable range.

According to some embodiments, when the calculated capacitance is outside the allowable range, the capacitance calculation equation may be reset. For example, the capacitance calculation equation may be reset by recalculating the plurality of the coefficients and recalculating the corrected coefficients again.

For example, when the calculated capacitance exceeds a certain range (e.g., a set or predetermined range, for example, a value obtained by dividing the difference between the calculated capacitance and the measurement capacitances by the measurement capacitances is greater than 5% of the measurement capacitance), it may be determined that the calculated capacitance is outside the allowable range.

As described above, in the method for calculating the capacitance according to some embodiments, the capacitance may be calculated even during the manufacturing process, thereby preventing a quality of the display device from deteriorating. In addition, the capacitance may be calculated using parameters related to the manufacturing process through the capacitance calculation equation without using the capacitance measuring device. Accordingly, a manufacturing yield for the manufacturing process of the display device may be increased.

FIG. 5 is a diagram illustrating deposition coefficients, exposure coefficients, and etching coefficients for each of measurement capacitances.

Referring to FIG. 5, there may be n deposition parameters affecting the first to m-th measurement capacitances. For example, a first deposition parameter may relate to the deposition temperature, a second deposition parameter may relate to the deposition pressure, a third deposition parameter may relate to the deposition time, and a n-th deposition parameter may relate to the deposition speed. There may be p exposure parameters affecting the first to m-th measurement capacitances. For example, a first exposure parameter may relate to the exposure temperature, a second exposure parameter may relate to the exposure time, a third exposure parameter may relate to the exposure speed, and a p-th exposure parameter may relate to the exhaust pressure. There may be q etching parameters affecting the first to m-th measurement capacitances. For example, a first etching parameter may relate to the etching pressure, a second etching parameter may relate to the etching time, a third etching parameter may relate to the etching rate, and a q-th etching parameter may relate to the etching temperature (where n, p and q are natural numbers equal to or greater than 2).

First to n-th deposition coefficients corresponding to the first measurement capacitance and first to n-th deposition coefficients corresponding to the m-th measurement capacitance may be calculated by the multiple regression analysis. First to p-th exposure coefficients corresponding to the first measurement capacitance and first to p-th exposure coefficients corresponding to the m-th measurement capacitance may be calculated by the multiple regression analysis. In addition, first to q-th etching coefficients corresponding to the first measurement capacitance and first to q-th etching coefficients corresponding to the m-th measurement capacitance may be calculated by the multiple regression analysis.

For example, the first deposition coefficient for the first measurement capacitance to the first deposition coefficient for the m-th measurement capacitance may be calculated through the Bayesian theorem to calculate a first corrected deposition coefficient. In addition, the n-th deposition coefficient for the first measurement capacitance to the n-th deposition coefficient for the m-th measurement capacitance may be calculated through the Bayesian theorem to calculate an n-th corrected deposition coefficient. This can be applied equally to the corrected exposure coefficient and the corrected etching coefficient.

Figure 6:
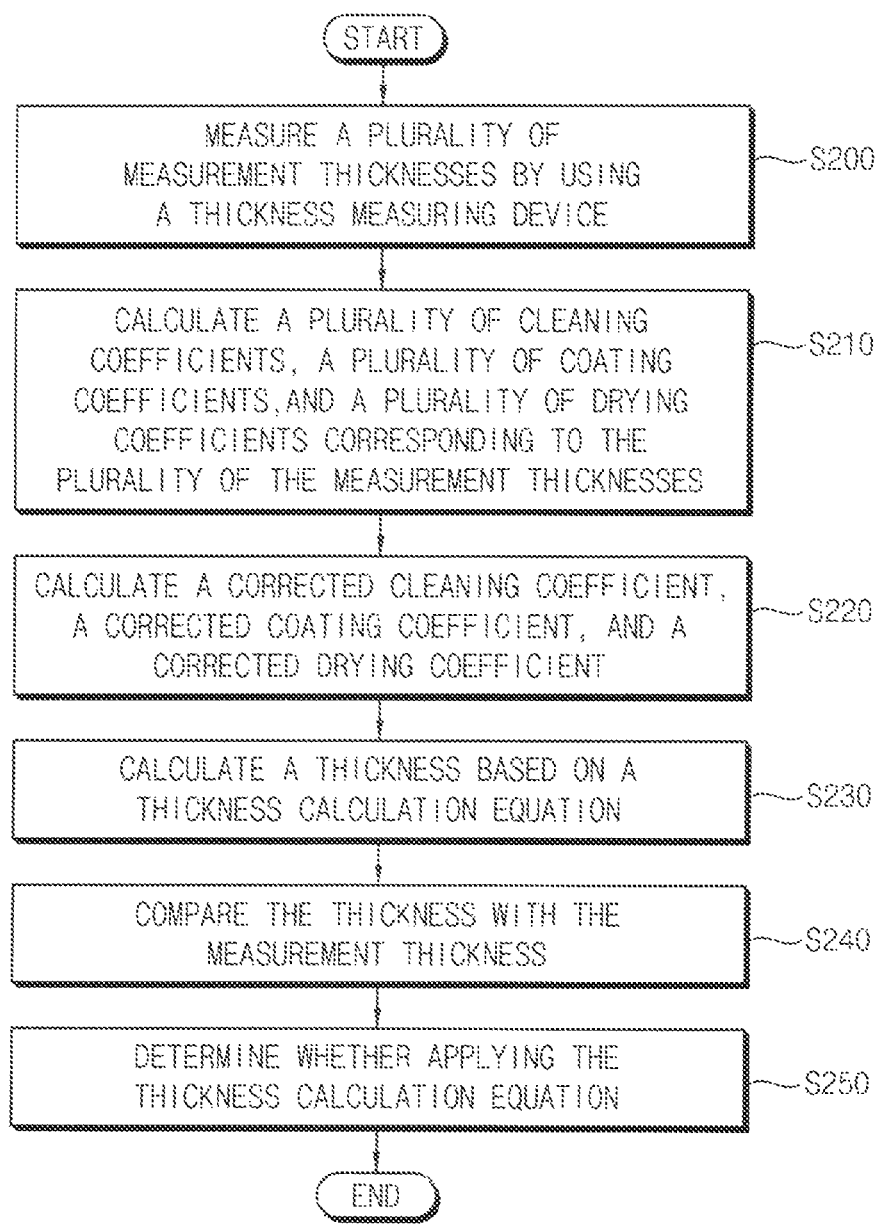
FIG. 6 is a flowchart illustrating a method for calculating a thickness of a substrate according to some embodiments of the present invention.

FIG. 6 is a flowchart illustrating a method for calculating a thickness of a substrate according to some embodiments of the present invention, and FIG. 7 is a diagram illustrating a cleaning coefficient, a coating coefficient, and a drying coefficient for each of measurement thicknesses.

Referring to FIGS. 6 and 7, a plurality of measurement thicknesses may be measured using the thickness measurement device (S200). The measurement may be performed on a certain area of the display device. For example, the measurement may be performed over a number of times in a same area of the substrate. Further, the measurement may be performed for each of the plurality of areas after dividing the substrate into a plurality of areas.

Thereafter, a plurality of cleaning coefficients, a plurality of coating coefficients, and a plurality of drying coefficients corresponding to each of the plurality of the measurement thicknesses may be calculated (S210). According to some embodiments, the substrate may be manufactured through a cleaning process, a coating process, a drying process, or the like. Accordingly, the relationship between the parameters and the measurement thicknesses may be grasped using the measurement thicknesses, and a cleaning parameter for the cleaning process, a coating parameter for the coating process, a drying parameter for the drying process, and the like. According to some embodiments, in order to determine the relationship, the plurality of cleaning coefficients, the plurality of coating coefficients, and the plurality of drying coefficients may be calculated by multiple regression analysis.

According to some embodiments, the plurality of the cleaning coefficients for the cleaning parameter corresponding to each of the plurality of the measurement thickness may be calculated. For example, the cleaning parameter may relate to any one of a cleaning pressure, a cleaning rate, a number of cleaning, and a cleaning time. However, this is merely an example, and the cleaning parameter may further include parameters affecting the cleaning process.

According to some embodiments, the plurality of the coating coefficients for the coating parameter corresponding to each of the plurality of measurement thickness may be calculated. For example, the coating parameter may relate to any one of a coating time, a coating speed, a coating temperature, and a coating pressure. However, this is merely an example, and the coating parameter may further include parameters affecting the coating process.

According to some embodiments, the plurality of the drying coefficients for the drying parameter corresponding to each of the plurality of the measurement thicknesses may be calculated. For example, the drying parameter may relate to any one of a drying temperature, a drying speed, a drying time, and humidity. However, this is merely an example, and the drying parameter may further include parameters affecting the drying process.

For example, the first to m-th measurement thicknesses may be measured. The cleaning parameter affecting the first to mth measurement thicknesses may be related to the cleaning pressure. The coting parameter that affects the first to m-th measurement thickness may be related to the coating time. The drying parameter affecting the first to mth measurement thicknesses may be related to the drying temperature. A cleaning coefficient, a coating coefficient, and a drying coefficient for the first measurement thickness may be calculated by the multiple regression analysis. In addition, the cleaning coefficient, the coating coefficient, and a drying coefficient for the m-th measurement thickness may be calculated by the multiple regression analysis.

After that, a corrected cleaning coefficient, a corrected coating coefficient, and a corrected drying coefficient may be calculated (S220). The corrected cleaning coefficient, the corrected coating coefficient, and the corrected drying coefficient may be calculated by Bayesian theorem. According to some embodiments, the corrected cleaning coefficient, the corrected coating coefficient, and the corrected drying coefficient may be calculated by arithmetic mean. However, this is merely an example, and the corrected cleaning coefficient, the corrected coating coefficient, and the corrected drying coefficient may be calculated by various methods. According to some embodiments, the corrected cleaning coefficient for the plurality of the cleaning coefficients may be calculated. For example, for the cleaning coefficient for the first measurement thickness to the cleaning coefficient for the m-th measurement thickness, a corrected cleaning coefficient may be calculated through the Bayesian theorem. The corrected coating coefficients for the plurality of the coating coefficients may be calculated. For example, the coating coefficient for the first measurement thickness to the coating coefficient for the m-th measurement thickness may be calculated through the Bayesian theorem to calculate the corrected coating coefficient. A corrected drying coefficient for the plurality of the drying coefficients may be calculated. For example, a corrected drying coefficient may be calculated for the drying coefficient for the first measurement thickness to the drying coefficient for the m-th measurement thickness through the Bayesian theorem.

Thereafter, the thickness of substrate may be calculated based on the thickness calculation equation (S130). The thickness calculation equation may include the cleaning parameter, the corrected cleaning coefficient, the coating parameter, the corrected coating coefficient, the drying parameter, and the corrected drying coefficient. For example, the thickness may be calculated by adding a product of the cleaning parameter and the corrected cleaning coefficient, a product of the coating parameter and the corrected coating coefficient, and a product of the drying parameter and the corrected drying coefficient.

An expected thickness according to a change in process conditions for the cleaning process, the coating process, and the drying process may be predicted through the thickness calculation equation. For example, when the manufacturing process of the substrate is performed by changing the cleaning pressure and the coating temperature, the expected thickness may be predicted by substituting the changed cleaning parameter and the changed coating parameter into the thickness calculation equation. Accordingly, when the substrate has the unexpected capacitance, it is possible to determine which parameter is caused by the predicted thickness.

After comparing the calculated thickness with the measurement thickness (S240), it is possible to determine whether to apply the thickness calculation equation (S250). According to some embodiments, when the calculated thickness is within an allowable range, the manufacturing process of the display device may be continued by applying the thickness calculation equation. In addition, when manufacturing a separate display device, the thickness calculation equation may be used.

For example, when a difference between the calculated thickness and the measurement thicknesses is less than a certain range (e.g., less than 0.5% of the measurement thickness), it may be determined that the calculated thickness is within the allowable range.

According to some embodiments, when the calculated thickness is outside the allowable range, the thickness calculation equation may be reset. For example, the thickness calculation equation may be reset by recalculating the plurality of the coefficients and recalculating the corrected coefficients again.

For example, when the calculated thickness exceeds a certain range (e.g., a value obtained by dividing the difference between the calculated thickness and the measurement thicknesses by the measurement thicknesses is greater than 2% of the measurement capacitance), it may be determined that the calculated thickness is outside the allowable range.

FIG. 8 is a diagram illustrating cleaning coefficients, coating coefficients and drying coefficients for each of the measurement thicknesses.

Referring to FIG. 8, there may be n cleaning parameters affecting the first to m-th measurement thicknesses. For example, a first cleaning parameter may relate to the cleaning temperature, a second cleaning parameter may relate to the cleaning pressure, a third cleaning parameter may relate to the cleaning time, and a n-th cleaning parameter may relate to the cleaning speed. There may be p coating parameters affecting the first to m-th measurement thicknesses. For example, a first coating parameter may relate to the coating temperature, a second coating parameter may relate to the coating time, a third coating parameter may relate to the coating speed, and a p-th coating parameter may relate to the coating pressure. There may be q drying parameters affecting the first to m-th measurement thicknesses. For example, a first drying parameter may relate to the drying pressure, a second drying parameter may relate to the drying time, a third drying parameter may relate to the drying rate, and a q-th drying parameter may relate to the drying temperature.

First to n-th cleaning coefficients corresponding to the first measurement thickness and first to n-th cleaning coefficients corresponding to the m-th measurement thickness may be calculated by the multiple regression analysis. First to p-th coating coefficients corresponding to the first measurement thickness and first to p-th coating coefficients corresponding to the m-th measurement thickness may be calculated by the multiple regression analysis. In addition, first to q-th drying coefficients corresponding to the first measurement thickness and first to q-th drying coefficients corresponding to the m-th measurement thickness may be calculated by the multiple regression analysis.

For example, the first cleaning coefficient for the first measurement thickness to the first cleaning coefficient for the m-th measurement thickness may be calculated through the Bayesian theorem to calculate a first corrected cleaning coefficient. In addition, the n-th cleaning coefficient for the first measurement thickness to the n-th cleaning coefficient for the m-th measurement thickness may be calculated through the Bayesian theorem to calculate an n-th corrected cleaning coefficient. This can be applied equally to the corrected coating coefficient and the corrected drying coefficient.

As described above, in the method for calculating the thickness according to some embodiments, the thickness may be calculated even during the manufacturing process, thereby preventing a quality of the display device from deteriorating. In addition, it is possible to determine whether the display device is defective during a manufacturing process based on the parameters without separate measurement, so that a manufacturing yield of the display device may be increased.

While the present inventive concept has been shown and described with reference to some embodiments thereof, it will be apparent to those of ordinary skill in the art that that various changes in form and details may be made thereto with departing from the spirit and scope of the present inventive concept as set forth by the following claims, and their equivalents.

What is claimed is:

1. A method for calculating a capacitance based on a deposition parameter for a deposition process, an exposure parameter for an exposure process, and an etching parameter for an etching process during a manufacturing process of a display device, the method comprising:
   measuring a plurality of measurement capacitances using a capacitance measurement device;
   calculating a plurality of deposition coefficients for the deposition parameter corresponding to each of the plurality of the measurement capacitances, a plurality of exposure coefficients for the exposure parameter corresponding to each of the plurality of the measurement capacitances, and a plurality of etching coefficients for the etching parameter corresponding to each of the plurality of the measurement capacitances;
   calculating a corrected deposition coefficient for the plurality of the deposition coefficients, a corrected exposure coefficient for the plurality of the exposure coefficients, and a corrected etching coefficient for the plurality of the etching coefficients;
   calculating the capacitance based on a capacitance calculation equation including the deposition parameter, the corrected deposition coefficient, the exposure parameter, the corrected exposure coefficient, the etching parameter, and the corrected etching coefficient;
   depositing a material of a display panel based on the deposition parameter, the corrected deposition coefficient, and the capacitance;
   exposing a portion of the display panel based on the exposure parameter, the corrected exposure coefficient, and the capacitance; and
   etching an area of the display panel based on the etching parameter, the corrected etching coefficient, and the capacitance.

2. The method of claim 1, wherein the plurality of deposition coefficients, the plurality of exposure coefficients, and the plurality of etching coefficients are calculated by multiple regression analysis.

3. The method of claim 1, wherein the corrected deposition coefficient, the corrected exposure coefficient, and the corrected etching coefficient are calculated by a Bayesian theorem.

4. The method of claim 1, wherein the manufacturing process of the display device is performed by applying the capacitance calculation equation, after calculating the capacitance in response to the calculated capacitance being within an allowable range by comparing the plurality of the measurement capacitances with the calculated capacitance.

5. The method of claim 1, wherein the capacitance calculation equation is reset, after calculating the capacitance, in response to the calculated capacitance being outside an allowable range by comparing the plurality of the measurement capacitances with the calculated capacitance.

6. The method of claim 1, wherein the display device includes:
    an active layer;
    a gate electrode layer on the active layer, and at least partially overlapping the active layer;
    a source electrode layer on the gate electrode layer, and at least partially overlapping the gate electrode layer; and
    a lower electrode layer on the source electrode layer, and at least partially overlapping the source electrode layer.

7. The method of claim 6, wherein the capacitance is a capacitance between the active layer and the gate electrode layer.

8. The method of claim 6, wherein the capacitance is a capacitance between the gate electrode layer and the source electrode layer.

9. The method of claim 6, wherein the capacitance is a capacitance between the source electrode layer and the lower electrode layer.

10. The method of claim 6, wherein the capacitance is a capacitance between the active layer, the gate electrode layer, and the source electrode layer.

11. The method of claim 6, wherein the capacitance is a capacitance between the gate electrode layer, the source electrode layer, and the lower electrode layer.

12. The method of claim 6, wherein the deposition process includes a chemical vapor deposition process and the etching process includes a dry etching process.

* * * * *